United States Patent
Takaishi

(10) Patent No.: US 8,399,915 B2
(45) Date of Patent: Mar. 19, 2013

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 81 days.

(21) Appl. No.: 12/598,961

(22) PCT Filed: Apr. 28, 2008

(86) PCT No.: PCT/JP2008/058173
§ 371 (c)(1),
(2), (4) Date: Nov. 5, 2009

(87) PCT Pub. No.: WO2008/139915
PCT Pub. Date: Nov. 20, 2008

(65) Prior Publication Data
US 2010/0090258 A1   Apr. 15, 2010

(30) Foreign Application Priority Data

May 8, 2007   (JP) ................... 2007-123408

(51) Int. Cl.
*H01L 29/04* (2006.01)
(52) U.S. Cl. ........ 257/255; 257/627; 257/521; 257/213; 257/244; 257/E27.091; 257/E29.004
(58) Field of Classification Search ............ 257/213, 257/220, 242, 244, 255, 270, 329, 330, 331, 257/341, 342, 521, 627, E27.091, E29.004
See application file for complete search history.

(56) References Cited

U.S. PATENT DOCUMENTS

| 7,091,555 | B2 * | 8/2006 | Yoshimochi | 257/330 |
| 8,039,877 | B2 * | 10/2011 | Ngai et al. | 257/255 |
| 2002/0104988 | A1 | 8/2002 | Shibata et al. | |
| 2005/0161734 | A1 | 7/2005 | Miyata et al. | |

FOREIGN PATENT DOCUMENTS

| JP | 10-154810 | 6/1998 |
| JP | 2002-231948 | 8/2002 |
| JP | 2004-349428 | 12/2004 |
| JP | 2005-244168 | 9/2005 |

* cited by examiner

*Primary Examiner* — Ha Tran T Nguyen
*Assistant Examiner* — Suberr Chi
(74) *Attorney, Agent, or Firm* — Fish & Richardson P.C.

(57) ABSTRACT

Provided is a semiconductor device which can reduce on-resistance by improving hole mobility of a channel region. A trench gate type MOSFET (semiconductor device) is provided with a $p^+$-type silicon substrate whose crystal plane of a main surface is a (110) plane; an epitaxial layer formed on the silicon substrate; a trench, which is formed on the epitaxial layer and includes a side wall parallel to the thickness direction (Z direction) of the silicon substrate; a gate electrode formed inside the trench through a gate dielectric film; an n-type channel region formed along the side wall of the trench; and a $p^+$-type source region and a $p^-$-type drain region which are formed to sandwich the channel region in the thickness direction (Z direction) of the silicon substrate. The trench is formed to have the crystal plane of the side wall as a (110) plane.

20 Claims, 8 Drawing Sheets

SEMICONDUCTOR DEVICE

TECHNICAL FIELD

The present invention relates to a semiconductor device, and in particular, to a trench gate type semiconductor device having a gate electrode formed in a trench.

BACKGROUND ART

Trench gate type semiconductor devices (MOSFET: metal oxide semiconductor field effect transistor) having a gate electrode formed in a trench (groove) have conventionally been known (see, for example, Patent Document 1).

FIG. 15 is a sectional view showing the structure of the conventional trench gate type MOSFET disclosed in the above-mentioned Patent Document 1. As shown in FIG. 15, in the conventional trench gate type MOSFET, a common drain region 102 is formed in a surface layer of a semiconductor substrate 101 by an epitaxial growth method. In a surface layer of the common drain region 102, a channel layer 103 is formed by impurity diffusion. In part of a surface layer of the channel layer 103, a source region 104 is formed by impurity diffusion. A trench 105 is formed to penetrate the common drain region 102 and the channel layer 103. The trench 105 is structured such that the bottom surface and side surfaces (side walls) each have the (100) direction. A gate dielectric film 106 is formed on the inner wall (bottom and side surfaces) of the trench 105, and a gate electrode 107 is formed on the gate dielectric film 106 so as to fill the trench 105.
Patent Document 1: JP-A-H10-154810

DISCLOSURE OF THE INVENTION

Problems to be Solved by the Invention

However, the conventional trench gate type MOSFET shown in FIG. 15 is inconvenient in that, if it is structured as a p-channel type MOSFET by using a p-type semiconductor substrate, the channel mobility of holes (positive holes) serving as majority carriers is degraded to cause an increase in on-resistance.

The present invention has been made to solve the problem described above, and an object of the present invention is to provide a semiconductor device capable of reducing on-resistance by improving mobility of holes in a channel region.

Means for Solving the Problem

To achieve the above object, according to the present invention, a semiconductor device is provided with: a p-type semiconductor substrate a crystal plane of a main surface of which is a (110) plane or an off-plane inclined at a predetermined off-angle with respect to the (110) plane; a semiconductor layer formed on the semiconductor substrate; a trench formed in the semiconductor layer to have a side wall parallel to a thickness direction of the semiconductor substrate; a gate electrode formed inside the trench with a gate dielectric film laid between the gate electrode and the trench; an n-type channel region formed along the side wall of the trench; and a p-type source region and a p-type drain region formed to hold the channel region therebetween in the thickness direction of the semiconductor substrate. Here, in the present invention, the off-plane inclined at a predetermined off-angle with respect to the (110) plane is an off-plane that is substantially the (110) plane, including, for example, plane (551) that is 8° off from the (110) plane in the <100> direction.

With the semiconductor device according to the present invention, since the n-type channel region is formed along the side wall of the trench and the p-type source region and the p-type drain region are formed so as to hold the n-type channel region therebetween in the thickness direction of the semiconductor substrate as described above, it is possible to make holes (positive holes) as majority carriers flow in the thickness direction of the semiconductor substrate. Also, since the crystal plane of the main surface of the semiconductor substrate is the (110) plane or an off-plane inclined at a predetermined off-angle with respect to the (110) plane, the thickness direction of the semiconductor substrate can be the <110> direction or a direction in the vicinity thereof. Lattice density is small in the <110> direction and the direction in the vicinity thereof, and thus, with the above-described structure, it is possible to reduce lattice scattering of holes occurring due to crystal lattices when holes are moved in the thickness direction of the semiconductor substrate. This helps improve the mobility of holes in the channel region, and thus, resistance in the channel region can be reduced when an inversion layer is formed in the channel region by applying a voltage to the gate electrode inside the trench and holes are moved via the inversion layer. As a result, in a case in which a p-channel type semiconductor device is formed by using a p-type semiconductor substrate, on-resistance of the semiconductor device can be reduced. Advantages resulting from reduced on-resistance are, less power consumption, improved switching characteristic, and the like.

Preferably, in the above-described semiconductor device according to the present invention, the trench is formed such that a crystal plane of the side wall thereof is the (110) plane or a crystal plane in a vicinity of the (110) plane. With this structure, the mobility of holes in the channel region can be easily improved, and thus, the on-resistance of a p-channel type semiconductor device can be easily reduced. In the present invention, a crystal plane in the vicinity of the (110) plane is one that is substantially the (110) plane.

Preferably, in the above-described semiconductor device according to the present invention, a plurality of trenches are formed as the trench such that the trenches extend along a first direction that is parallel to the main surface of the semiconductor substrate and are arranged at predetermined intervals in a second direction that intersects the first direction. This structure helps increase a total area of inversion layers formed in the vicinity of the side walls of the trenches when a voltage is applied to the gate electrode in each of the trenches, and thus facilitates improvement of the mobility of holes in the channel region. As a result, the on-resistance of the semiconductor device can be reduced more easily.

Preferably, in the above-described semiconductor device according to the present invention, a dielectric layer is formed inside the trench on a top surface of the gate electrode such that a top surface of the dielectric layer is flush with a top surface of the semiconductor layer. With this structure, the dielectric layer formed on one trench can be kept out of contact with the dielectric layer formed on another trench adjacent to the one trench, and thus a plurality of trenches can be formed at small intervals. By thus reducing the distance between adjacent trenches, trench density in a unit area can be increased, and thus the total area of the inversion layers formed in the vicinity of the side walls of the trenches in the channel region can be easily increased. Since the mobility of holes in the channel region can be improved more easily in this way, the on-resistance of the semiconductor device can be reduced more easily.

Advantages of the Invention

As described above, according to the present invention, a semiconductor device capable of reducing the on-resistance can be easily achieved by improving the mobility of holes in the channel region.

Figure 1:
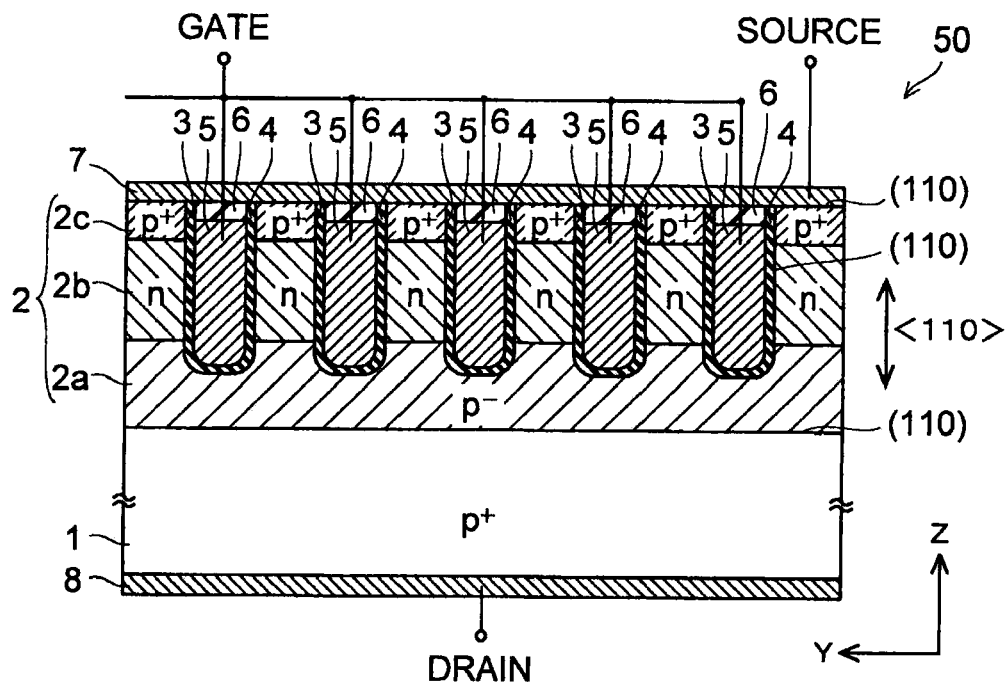
FIG. 1 A sectional view showing the structure of a MOSFET embodying the present invention.

LIST OF REFERENCE SYMBOLS 1 silicon substrate (semiconductor substrate)
2 epitaxial layer (semiconductor layer)
2a drain region
2b channel region
2c source region, p$^+$-type impurity region
3 trench
4 gate dielectric film
5 gate electrode
6 interlayer dielectric film (dielectric layer)
7 source electrode
8 drain electrode
9 pad electrode
10 silicon wafer
10a orientation flat surface

BEST MODE FOR CARRYING OUT THE INVENTION

Hereinafter, descriptions will be given of embodiments embodying the present invention with reference to the drawings. The following descriptions deal with a trench gate type MOSFET (MOS field effect transistor) as an example of the semiconductor device according to the present invention.

Figure 2:
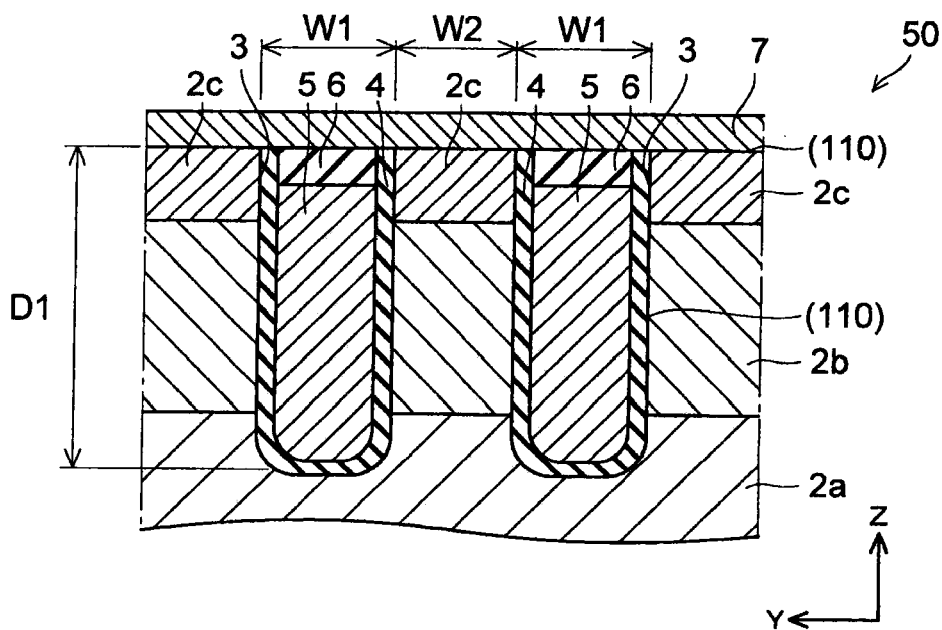
FIG. 2 An enlarged sectional view showing a portion around trenches of the MOSFET embodying the present invention shown in FIG. 1.
Figure 3:
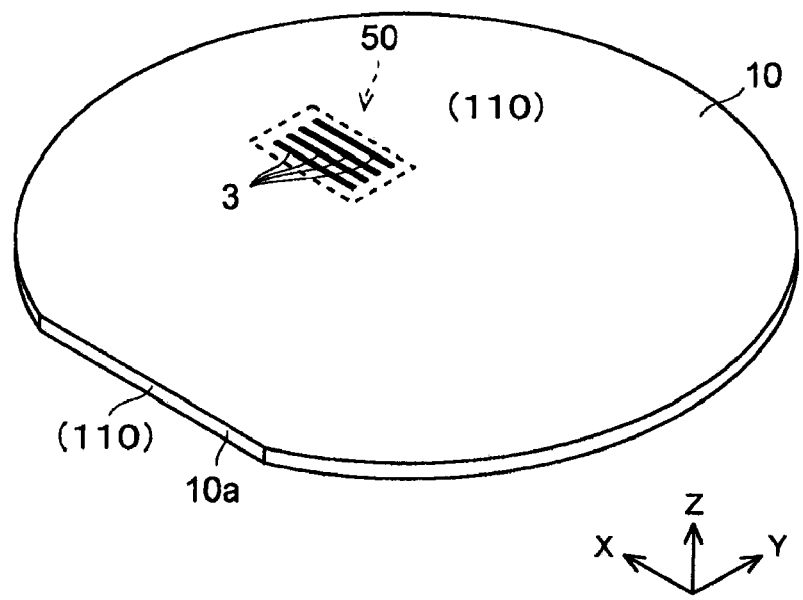
FIG. 3 A perspective view showing the structure of a silicon wafer used for the MOSFET embodying the present invention shown in FIG. 1.
Figure 4:
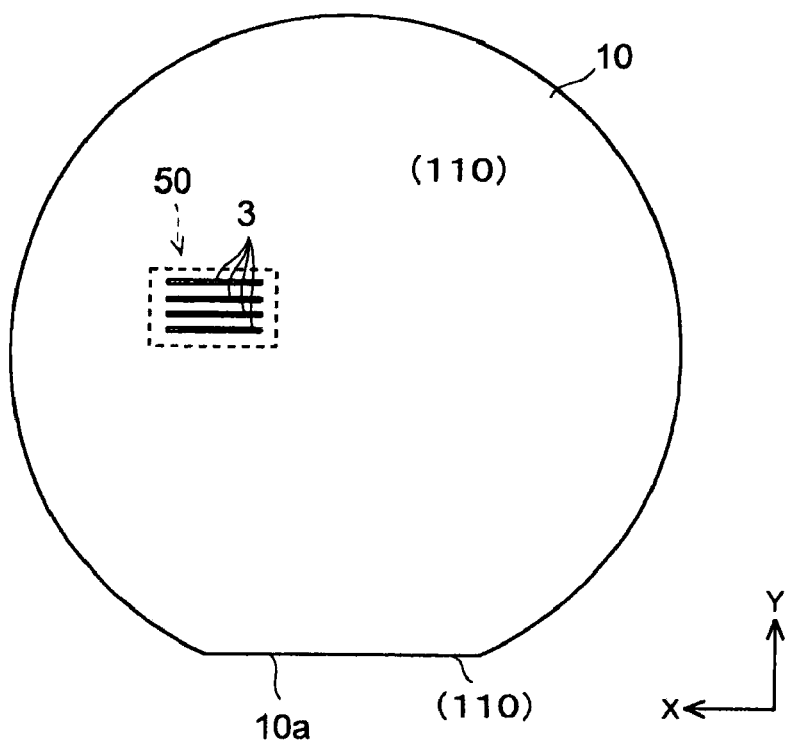
FIG. 4 A plan view showing the structure of the silicon wafer used for the MOSFET embodying the present invention shown in FIG. 1.
Figure 5:
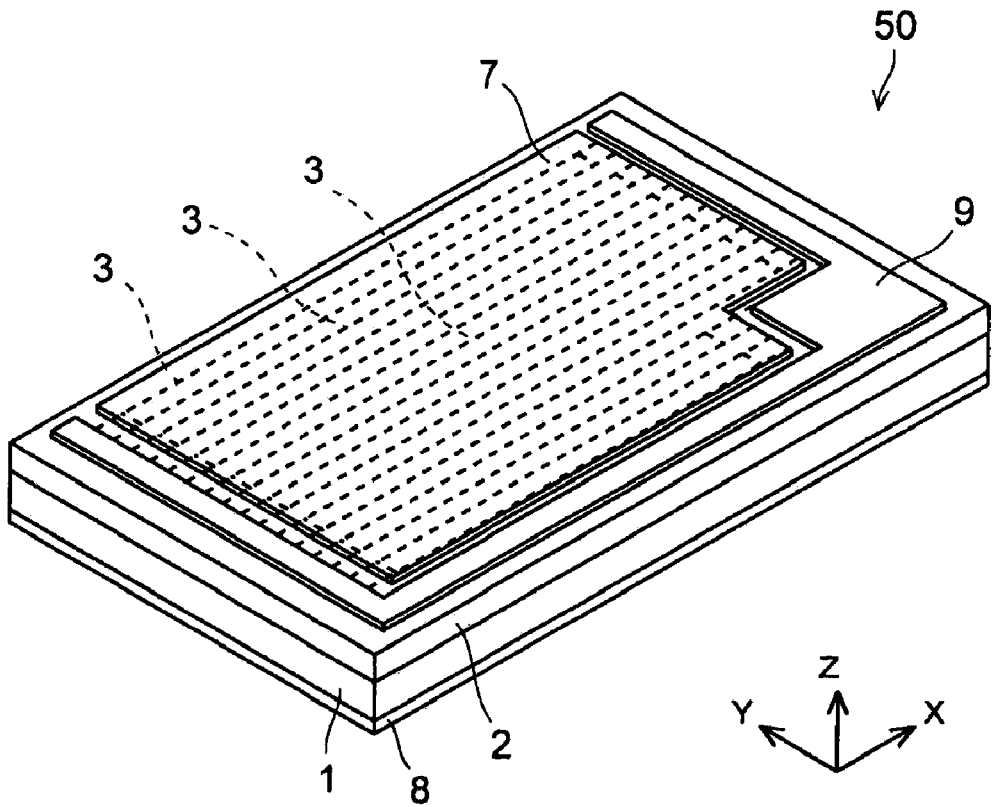
FIG. 5 A perspective view showing the structure of the MOSFET embodying the present invention shown in FIG. 1.

FIG. 1 is a sectional view showing the structure of a MOSFET embodying the present invention. FIG. 2 is an enlarged sectional view showing a portion around trenches of the MOSFET embodying the present invention shown in FIG. 1. FIG. 3 is a perspective view showing the structure of a silicon wafer used for the MOSFET embodying the present invention shown in FIG. 1. FIGS. 4 and 5 are diagrams showing the structure of the MOSFET embodying the present invention. First, with reference to FIGS. 1 to 5, a description will be given of the structure of the MOSFET 50 embodying the present invention.

In the MOSFET 50 embodying the present invention, as shown in FIG. 1, on a p$^+$-type silicon substrate 1 (specific resistance: approximately 5 mΩ) doped with B (boron) as a p-type impurity at a high concentration (for example, approximately $1 \times 10^{20}$ cm$^{-3}$), an epitaxial layer 2 of silicon is formed to have a thickness of approximately 1 to 20 μm. In the epitaxial layer 2, p$^-$-type drain region 2a doped with B (boron) as a p-type impurity at a low concentration (for example, approximately $1 \times 10^{15}$ cm$^{-3}$~approximately $1 \times 10^{16}$ cm$^{-3}$), an n-type channel region 2b doped with P (phosphorus) as an n-type impurity at a concentration of, for example, approximately $1 \times 10^{17}$ cm$^{-3}$, and a p$^+$-type source region 2c doped with B (boron) as a p-type impurity at a high concentration (for example, approximately $1 \times 10^{19}$ cm$^{-3}$~approximately $1 \times 10^{20}$ cm$^{-3}$) are formed one on top of another in this order from the silicon substrate 1 side. A plurality of trenches 3 are formed in the epitaxial layer 2 so as to penetrate the source region 2c and the channel region 2b. The trenches 3 are each formed such that the depth direction thereof is the same as the thickness direction of the epitaxial layer 2. That is, the trenches 3 are each structured such that the side walls thereof are parallel to the thickness direction of the epitaxial layer 2 (silicon substrate 1). The silicon substrate 1 is an example of the "semiconductor substrate" of the present invention, and the epitaxial layer 2 is an example of the "semiconductor layer" of the present invention.

Here, in this embodiment, the silicon substrate 1 is formed such that the crystal plane of the main surface thereof is the (110) plane. Thus, the epitaxial layer 2 on the silicon substrate 1 is also formed such that the crystal plane of the main surface thereof is the (110) plane. As a result, the thickness direction (Z direction) of the silicon substrate 1 is the <110> direction.

The trenches 3 formed in the epitaxial layer 2 each have, as shown in FIG. 2, a depth D1 of approximately 1 μm to 5 μm and a width W1 of approximately 0.1 μm to approximately 0.5 μm. As shown in FIGS. 1 and 2, gate dielectric films 4 made of SiO$_2$ are formed on the inner walls (bottom and side surfaces) of the trenches 3. Gate electrodes 5 are formed one inside each of the trenches 3 such that the above-mentioned gate dielectric film 4 is laid between the inner wall of the trench 3 and the gate electrode 5. The gate electrodes 5 are formed of a polysilicon that is made conductive by introducing an impurity, and the gate electrodes 5 are formed such that the top surfaces thereof are located inside the trenches 3. On the top surfaces of the gate electrode 5 are formed interlayer dielectric films 6 made of SiO$_2$. The interlayer dielectric film 6 is an example of "dielectric layer" of the present invention. A portion of each of the gate dielectric films 4 at the side walls of each of the trenches 3 is formed to have a thickness of approximately 10 nm to approximately 100 nm.

The interlayer dielectric films 6 are formed such that the top surfaces thereof are substantially flush with the top surface of the epitaxial layer 2.

In this embodiment, as shown in FIGS. 3 and 4, the plurality of trenches 3 are each formed elongate to extend in an X direction that is a direction parallel to an orientation flat surface 10$a$ of a silicon wafer 10. The orientation flat surface 10$a$ of the silicon wafer 10 is formed to be the (110) plane. Thus, the trenches 3 are formed, as described above, such that the crystal planes of the side walls thereof are the (110) plane. The direction X is an example of "the first direction" of the present invention.

In this embodiment, as shown in FIG. 2, the trenches 3 are arranged at intervals W2 of approximately 0.1 μm to approximately 0.5 μm in a direction Y that is parallel to the top surface of the epitaxial layer 2 and intersects the direction X. That is, the trenches 3 are, as shown in FIGS. 3 to 5, formed in a pattern of stripes spaced at intervals W2 of approximately 0.1 μm to approximately 0.5 μm. The direction Y is an example of the "second direction" of the present invention.

As shown in FIGS. 1 and 2, the gate electrodes 5 are formed inside the trenches 3 such that the top surfaces of the gate electrodes 5 are above the channel region 2$b$ and the bottom surfaces thereof are below the channel region 2$b$. The channel region 2$b$ is formed along the side walls of the trenches 3. Thereby, when a voltage is applied to the gate electrodes 5, inversion layers (not illustrated) are formed along the side walls of the trenches 3 to function as current paths where holes as minority carriers of the n-type channel region 2$b$ are attracted close to the side walls of the trenches 3. Incidentally, the inversion layers (not illustrated) are each an extremely thin layer. And, via the inversion layers, holes as majority carriers of the p-channel type MOSFET moves between the source region 2$c$ and the drain region 2$a$, and as a result, a drain current flows in the Z direction of the MOSFET 50.

As shown in FIGS. 1 and 5, a source electrode 7 is formed on the top surface of the epitaxial layer 2, and a drain electrode 8 is formed on the bottom surface of the silicon substrate 1. As shown in FIG. 5, on a predetermined area of the top surface of the epitaxial layer 2 is formed a pad electrode 9 that is electrically connected to the gate electrodes 5.

In this embodiment, since, as described above, the n-type channel region 2$b$ is formed along the side walls of the trenches 3 and the p$^+$-type source region 2$c$ and the p$^-$-type drain region 2$a$ are formed so as to hold the n-type channel region 2$b$ therebetween in the thickness direction (Z direction) of the silicon substrate 1, holes (positive holes) as the majority carriers can be moved in the thickness direction (Z direction) of the silicon substrate. In addition, by making the crystal plane of the main surface of the silicon substrate 1 the (110) plane, the thickness direction of the silicon substrate 1 can be the <110> direction. Lattice density is small in the <110> direction, and thus, with the above-described structure, it is possible to reduce lattice scattering of holes occurring due to crystal lattices when the holes are moved in the thickness direction of the semiconductor substrate 1. This helps improve the mobility of holes in the channel region 2$b$ when inversion layers are formed in the channel region 2$b$ by applying a voltage to the gate electrodes 5 inside the trenches 3 and holes are moved via the inversion layers. As a result, in the case in which the p-channel type MOSFET 50 is formed by using the pt-type silicon substrate 1, the on-resistance of the MOSFET 50 can be reduced. Incidentally, advantages resulting from reduced on-resistance are less power consumption, improved switching characteristic, and the like.

In this embodiment, the trenches 3 are formed such that the crystal planes of the side walls thereof are the (110) plane, and this helps easily improve the mobility of holes in the channel region 2$b$. As a result, the on-resistance of the MOSFET 50 formed as a p-channel type MOSFET can be reduced easily.

In this embodiment, since the trenches 3 are formed to extend in the X direction parallel to the main surface of the silicon substrate 1, and the thus formed trenches 3 are arranged at intervals W2 of approximately 0.1 μm to approximately 0.5 μm in the Y direction orthogonal to the X direction, it is possible to increase the total area of the inversion layers formed in the vicinity of the side walls of the trenches 3 in the channel region 2$b$ when a voltage is applied to the gate electrodes 5. This makes it easier to improve the mobility of holes in the channel region 2$b$, and as a result, the on-resistance can be reduced more easily.

In this embodiment, since the interlayer dielectric films 6 formed on the top surfaces of the gate electrodes 5 inside the trenches 3 such that the top surfaces of the gate electrodes 5 are flush with the top surface of the epitaxial layer 2, the interlayer dielectric films 6 formed in adjacent ones of the trenches 3 can be kept out of contact with each other, and thus the interval W2 between adjacent ones of the plurality of trenches 3 can be made smaller. By thus reducing the interval W2 between adjacent ones of the trenches 3, trench density in a unit area can be increased, and thus the total area of the inversion layers formed in the vicinity of the side walls of the trenches 3 in the channel region 2$b$ can be easily increased. This helps further facilitate improvement of the mobility of holes in the channel region 2$b$, and as a result, the on-resistance can be reduced more easily.

FIGS. 6 to 14 are sectional views for illustrating a production process of the MOSFET embodying the present invention shown in FIG. 1. Next, referring to FIGS. 1 to 14, a description will be given of a manufacturing process of the MOSFET 50 embodying the present invention.

Figure 6:
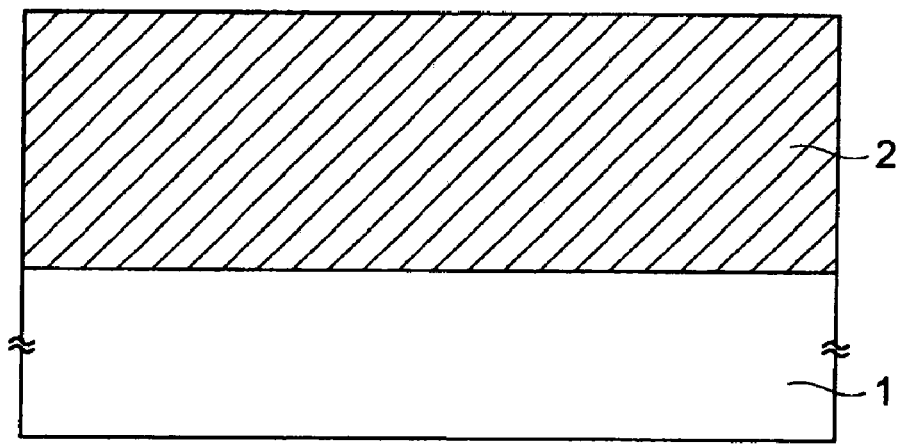
FIG. 6 A sectional view for illustrating a production process of the MOSFET embodying the present invention shown in FIG. 1.

First, as shown in FIG. 6, a p$^+$-type epitaxial layer 2 formed of a silicon doped with B (boron) of an impurity concentration of approximately $1 \times 10^{15}$ cm$^{-3}$ to approximately $1 \times 10^{16}$ cm$^{-3}$ is formed by an epitaxial growth method on a p$^+$-type silicon substrate 1 (specific resistance: approximately 5 mΩ) doped with B (boron) of an impurity concentration of approximately $1 \times 10^{20}$ cm$^{-3}$. Here, as shown in FIGS. 1, 3, and 4, the epitaxial layer 2 is formed on the silicon substrate 1 (silicon wafer 10) whose orientation flat surface 10$a$, as well as whose main surface, is the (110) plane. Thus, the epitaxial layer 2 is formed such that the main surface thereof is the (110) plane.

Figure 7:
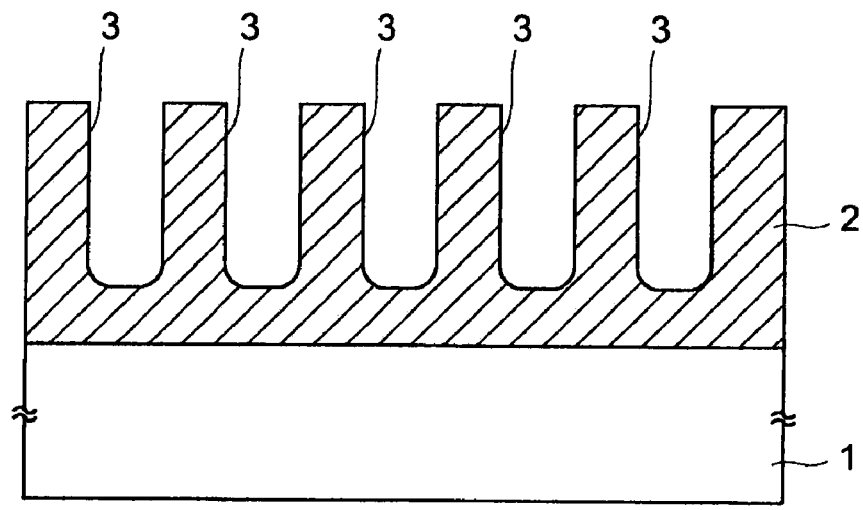
FIG. 7 A sectional view for illustrating the production process of the MOSFET embodying the present invention shown in FIG. 1.

Next, as shown in FIG. 7, by a photolithography technology and etching, a plurality of trenches 3 are formed on in the epitaxial layer 2. Also, as shown in FIGS. 3 and 4, the plurality of trenches 3 are each formed to extend in a direction (X direction) parallel to the orientation flat surface 10$a$ of the silicon wafer 10, and the plurality of trenches 3 are also formed, as shown in FIG. 2, such that an interval W2 between adjacent ones of the trenches 3 is approximately 0.1 μm to approximately 0.5 μm.

Next, sacrificial oxidation is conducted to remove a defect applied to the epitaxial layer 2 by etching, and a surface oxide (SiO$_2$: not shown) formed by the sacrificial oxidation is removed by etching.

Figure 8:
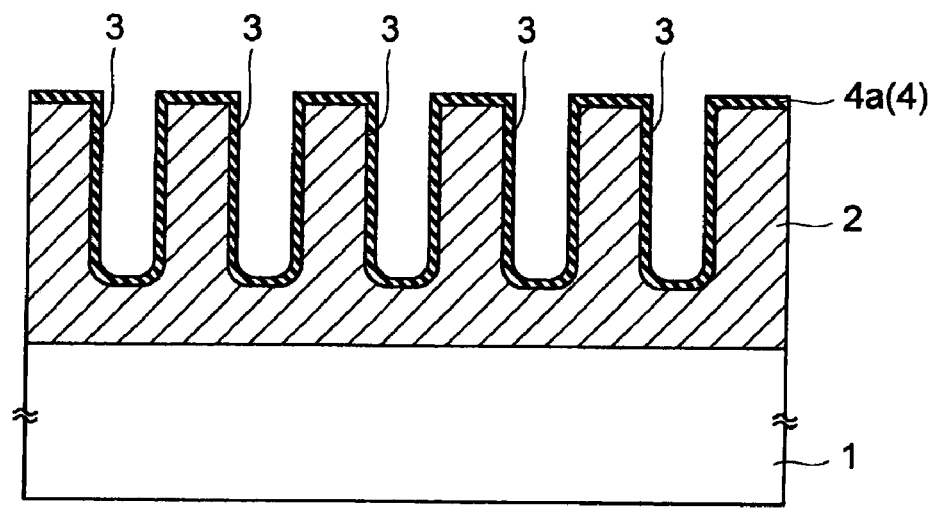
FIG. 8 A sectional view for illustrating the production process of the MOSFET embodying the present invention shown in FIG. 1.

Subsequently, as shown in FIG. 8, a surface oxide (SiO$_2$) layer 4$a$ is formed by performing thermal oxidation with respect to the silicon substrate 1 (silicon wafer 10). In this way, gate dielectric films 4 of SiO$_2$ are formed so as to cover the inner walls (the bottom and side surfaces) of the trenches 3. Here, the gate dielectric films 4 are made to grow to be approximately 10 nm to approximately 100 nm thick.

Figure 9:
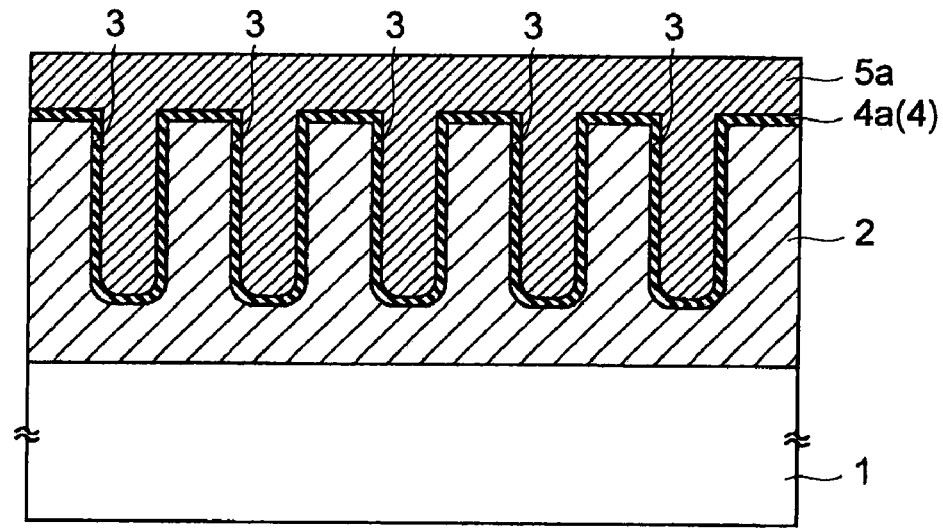
FIG. 9 A sectional view for illustrating the production process of the MOSFET embodying the present invention shown in FIG. 1.
Figure 10:
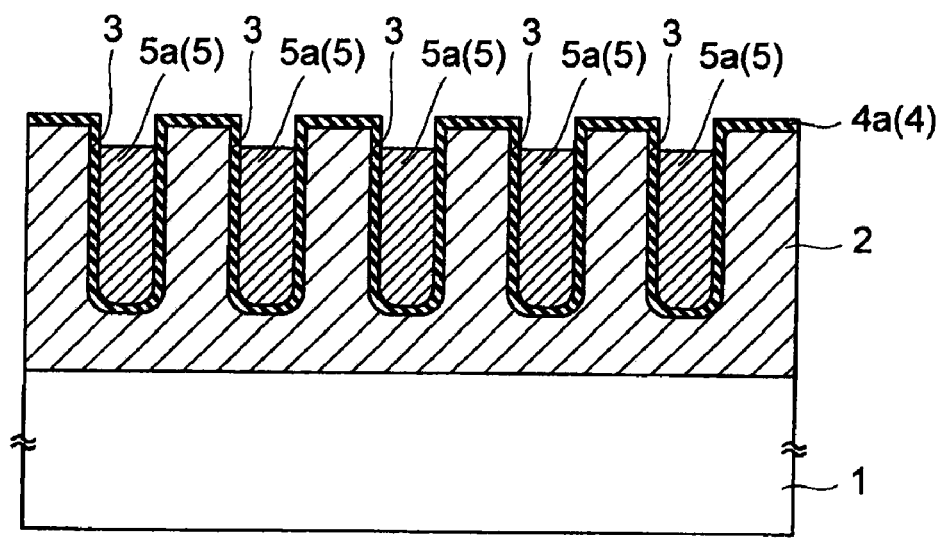
FIG. 10 A sectional view for illustrating the production process of the MOSFET embodying the present invention shown in FIG. 1.

Next, as shown in FIG. 9, by using a CVD method or the like, a polysilicon layer 5a that is made conductive by introducing an impurity is formed all over the surface of the epitaxial layer 2. And, as shown in FIG. 10, a predetermined area of the polysilicon layer 5a is removed by etch back. In this way, the top surface (etched back surface) of the polysilicon layer 5a, in each of the trenches 3, is formed below the top surface of the epitaxial layer 2, and thereby polysilicon gate electrodes 5 are formed inside the trenches 3.

Figure 11:
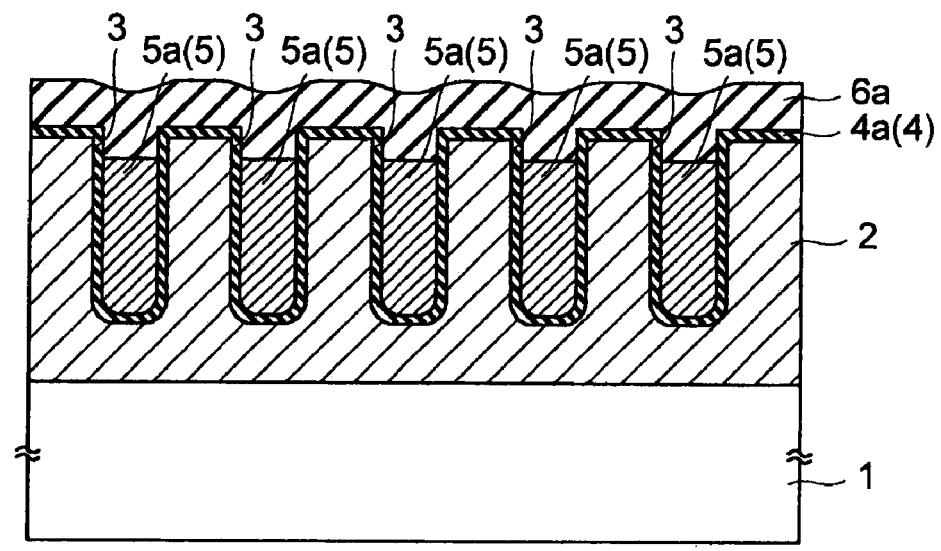
FIG. 11 A sectional view for illustrating the production process of the MOSFET embodying the present invention shown in FIG. 1.
Figure 12:
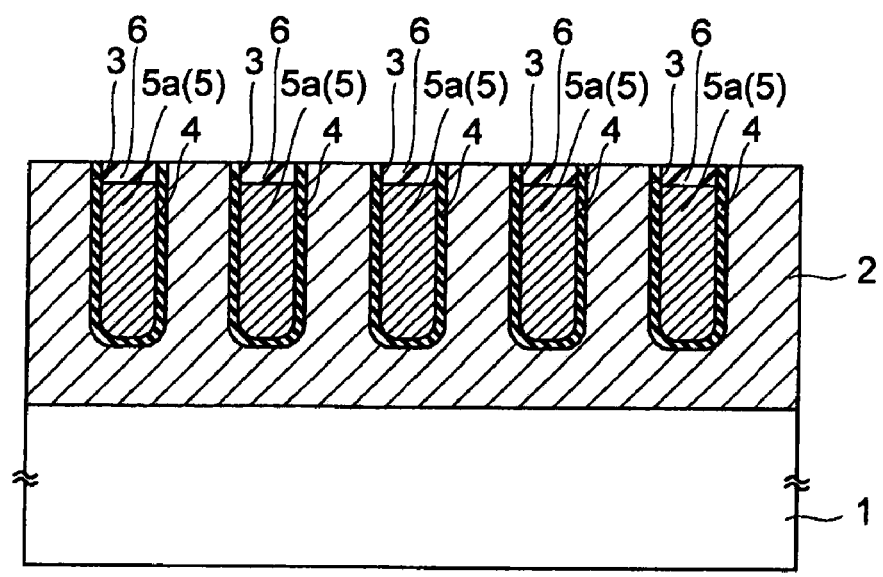
FIG. 12 A sectional view for illustrating the production process of the MOSFET embodying the present invention shown in FIG. 1.

Thereafter, as shown in FIG. 11, an $SiO_2$ layer 6a is formed all over the surface of the epitaxial layer 2, and the $SiO_2$ layer 6a and the surface oxide layer 4a are removed by etch back until the top surface of the epitaxial layer 2 appears. Thereby, as shown in FIG. 12, interlayer dielectric films 6 whose top surfaces are substantially flush with the top surface of the epitaxial layer 2 are formed on the top surfaces of the gate electrodes 5, and the top surface of the epitaxial layer 2 is made flat.

Figure 13:
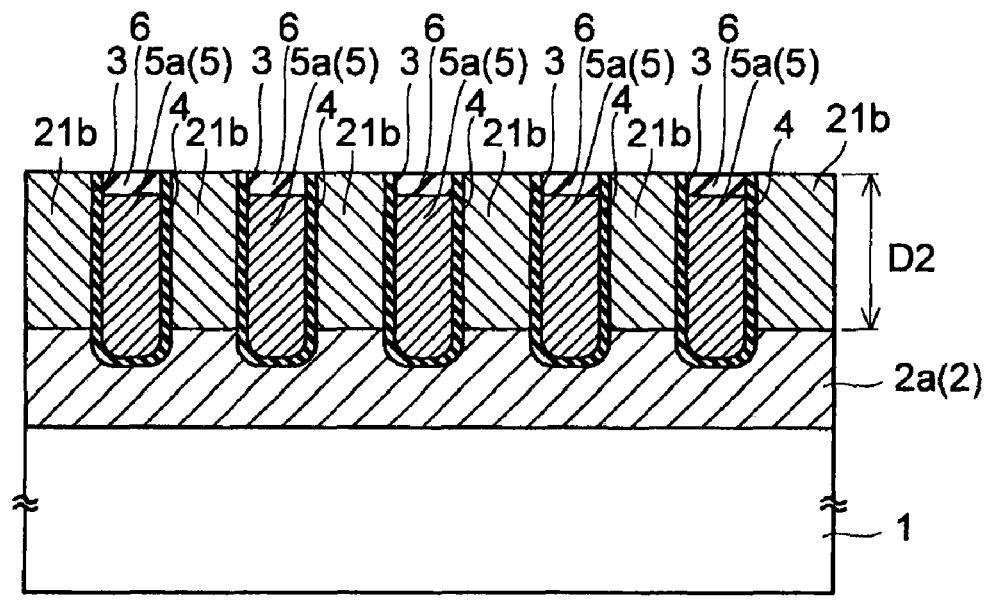
FIG. 13 A sectional view for illustrating the production process of the MOSFET embodying the present invention shown in FIG. 1.
Figure 14:
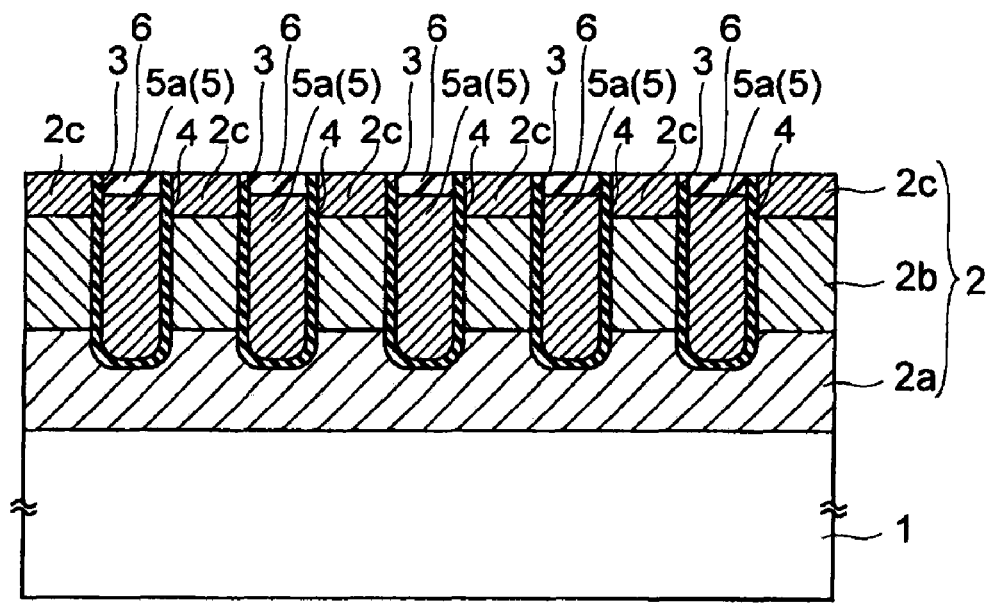
FIG. 14 A sectional view for illustrating the production process of the MOSFET embodying the present invention shown in FIG. 1.
Figure 15:
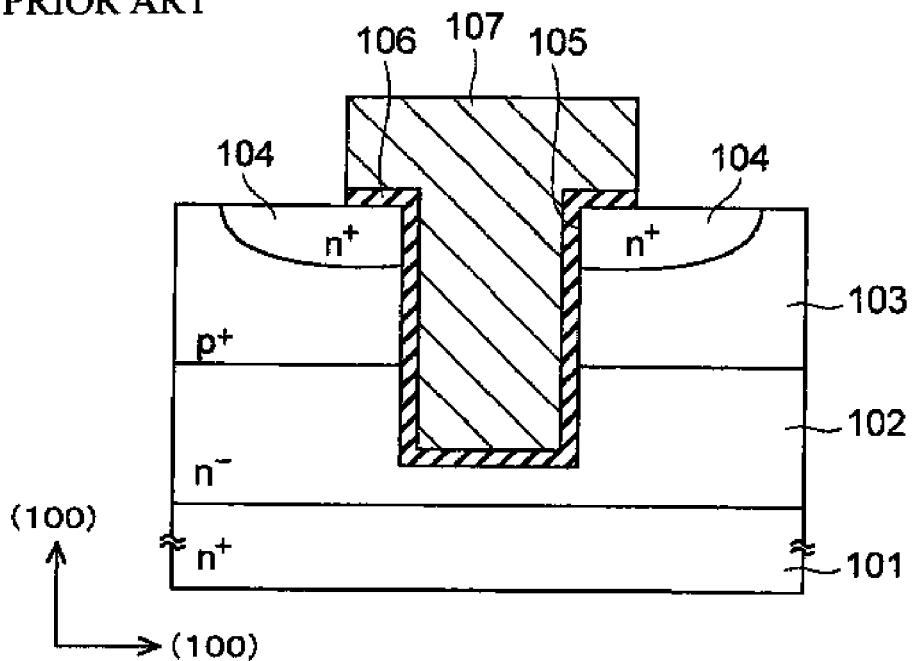
FIG. 15 A sectional view showing the structure of a conventional trench gate type MOSFET disclosed in Patent Document 1.

Next, as shown in FIG. 13, an n-type impurity region 21b is formed on the epitaxial layer 2, for example, by doping P (phosphorus) as an n-type impurity in the epitaxial layer 2 at a density of approximately $1 \times 10^{17}$ $cm^{-3}$ by, for example, ion implantation. Here, a doping depth D2 is such that a surface of the impurity region 21b that is closer to the bottom surfaces of the gate electrodes 4 is above the bottom surfaces of the gate electrodes 5. Specifically, the doping depth D2 is approximately 0.5 µm to approximately 2 µm. Next, as shown in FIG. 14, a $p^+$-type impurity region 2c is formed on the epitaxial layer 2, for example, by doping B (boron) as a p-type impurity in the epitaxial layer 2 at a density of approximately $1 \times 10^{19}$ $cm^{-3}$ to approximately $1 \times 10^{20}$ $cm^{-3}$ by, for example, ion implantation. In this way, a $p^-$-type drain region 2a, an n-type channel region 2b, and a $p^+$-type source region 2c are formed on the epitaxial layer 2 one on top of another in this order from the silicon substrate 1 side.

Finally, the source electrode 7 is formed on the top surface of the epitaxial layer 2 so as to contact the source region 2c, the drain electrode 8 is formed on the bottom surface of the silicon substrate 1, and, as shown in FIG. 5, on the predetermined region of the top surface of the epitaxial layer 2, the pad electrode 9 is formed to be electrically connected to the gate electrodes 5. In this way, the MOSFET 50 according to the embodiment of the present invention shown in FIG. 1 is formed.

In this embodiment, as described above, with a structure such that the main surface of the silicon substrate 1 and the side walls of the trenches 3 are the (110) plane, the gate dielectric films 4 can be formed on the inner walls of the trenches 3 to have a uniform thickness. This helps prevent inconvenience of dielectric strength being reduced due to the gate dielectric films 4 thinner at the bottom surfaces of the trenches 3 than at the side surfaces of the trenches 3.

The embodiments disclosed herein are to be considered in all respects as illustrative and not restrictive. The scope of the present invention is set out in the appended claims and not in the description of the embodiment hereinabove, and includes any variations and modifications within the sense and scope equivalent to those of the claims.

For example, although the above-described embodiment deals with a MOSFET as an example of the semiconductor device according to the present invention, but this is not meant to limit the present invention, and the present invention is also applicable to semiconductor devices other than MOSFETs.

In the example dealt with in the above embodiment, the crystal plane of the main surface of the silicon substrate is the (110) plane, but this is not meant to limit the present invention. As long as the crystal plane of the main surface of the silicon substrate can substantially be the (110) plane, it may be an off-plane that is inclined in the <100> direction at an off-angle of 2°, 4°, 8°, or the like with respect to the (110) plane. That is, an off-substrate may be used to produce a MOSFET. A crystal plane that is substantially the (110) plane is one having the (110), (551), (311), (221), (553), (335), (112), (113), (115), (117), (331), (332), (111), or (320) plane direction.

In the example dealt with in the above embodiment, the crystal planes of the side walls of the trenches are the (110) plane, but this is not meant to limit the present invention, and the crystal planes of the side walls of the trenches may be in the vicinity of the (110) plane, or may be a crystal plane other than the (110) plane. Here, a crystal plane in the vicinity of the (110) plane is one that is substantially the (110) plane.

In the example dealt with in the above embodiment, the interlayer dielectric films formed on the top surfaces of the gate electrodes are formed to be flush with the top surface of the epitaxial layer, but this is not mean to limit the present invention. The interlayer dielectric films may be formed on the top surface of the gate electrodes such that their top surfaces protrude above the top surface of the epitaxial layer, or such that their top surfaces are located below the top surface of the epitaxial layer (inside the trenches).

In the example dealt with in the above embodiment, the epitaxial layer is approximately 1 µm to approximately 20 µm thick. However, this is not meant to limit the present invention, and the epitaxial layer may have a thickness other than the above thickness. Specifically, the thickness of the epitaxial layer may be set according to final electrical properties required of the trench gate type MOSFET to be produced.

In the example dealt with in the above embodiment, impurity regions to respectively function as channel and source regions are formed after the trenches are formed; however, this is not meant to limit the present invention, and the impurity regions to respectively function as the channel and source regions may be formed before the trenches are formed.

In the example dealt with in the above embodiment, the impurity regions to respectively function as the channel and source regions are formed by ion implantation; however, this is not meant to limit the present invention, and the impurity regions to respectively function as the channel and source regions may be formed by a method other than ion implantation. For example, the impurity regions may be formed by thermal diffusion.

In the example dealt with in the above embodiment, B (boron) is used as the p-type impurity and P (phosphorus) is used as the n-type impurity; however, this is not meant to limit the present invention, and the a p-type impurity other than B (boron) may be used, and an n-type impurity other than P (phosphorus) may be used.

What is claimed is:
1. A semiconductor device comprising:
a p-type semiconductor substrate a crystal plane of a main surface of which is a (110) plane or an off-plane inclined at a predetermined off-angle with respect to the (110) plane;
a semiconductor layer on the semiconductor substrate;
an elongate trench in the semiconductor layer;
a gate electrode inside the elongate trench with a gate dielectric film between the gate electrode and the elongate trench, wherein the gate dielectric film is formed on a base surface of the elongate trench and is formed on a side wall of the elongate trench along its longitudinal direction;

an n-type channel region along a side wall of the elongate trench; and a p-type source region and a p-type drain region holding the channel region therebetween in a thickness direction of the semiconductor substrate, wherein a crystal plane of the base surface of the elongate trench and a crystal plane of the side wall of the elongate trench along its longitudinal direction are each a (110) plane, and wherein the gate dielectric film on the base surface and the gate dielectric film on the side wall along the longitudinal direction of the elongate trench have a same thickness.

2. The semiconductor device according to claim 1, wherein the trench is formed such that a long axis of a top surface of the elongate trench extends along a first direction that is parallel to the main surface of the semiconductor substrate and the elongate trench is composed of a plurality of trenches that are arranged at predetermined intervals in a second direction that intersects the first direction at right angles in plan view.

3. The semiconductor device according to claim 2, wherein the semiconductor device is cut out as a rectangular chip, a length of the chip in the first direction being longer than a length of the chip in the second direction.

4. The semiconductor device according to claim 1, wherein a dielectric layer is inside the elongate trench on a top surface of the gate electrode such that a top surface of the dielectric layer is flush with a top surface of the semiconductor layer.

5. The semiconductor device according to claim 1, wherein
a thickness of the semiconductor layer ranges from 1 µm to 20 µm;
an impurity concentration of the drain region ranges from $1 \times 10^{15}$ cm$^{-3}$ to $1 \times 10^{16}$ cm$^{-3}$; and
an impurity concentration of the source region ranges from $1 \times 10^{19}$ cm$^{-3}$ to $1 \times 10^{20}$ cm$^{-3}$.

6. The semiconductor device according to claim 1, wherein a width of the elongate trench ranges from 0.1 µm to 0.5 µm, and a depth of the elongate trench ranges from 1 µm to 5 µm.

7. The semiconductor device according to claim 1, wherein the elongate trench is composed of a plurality of trenches arranged at intervals of between 0.1 µm and 0.5 µm.

8. The semiconductor device according to claim 1, wherein a thickness of the gate dielectric film along the side wall of the elongate trench ranges from 10 nm to 100 nm.

9. The semiconductor device according to claim 1, wherein the predetermined off-angle is 2°, 4° or 8° in a <100> direction with respect to the (110) plane.

10. The semiconductor device according to claim 1, further comprising:
a source electrode on a top surface of the semiconductor layer; and
a pad electrode on the top surface of the semiconductor layer,
wherein the pad electrode is formed along three sides of the top surface and a portion of the pad electrode at a corner is wider than other portions of the pad electrode.

11. A semiconductor device, comprising:
a p-type semiconductor substrate a crystal plane of a main surface of which is a (110) plane or an off-plane inclined at a predetermined off-angle with respect to the (110) plane;
a semiconductor layer on the semiconductor substrate;
an elongate trench in the semiconductor layer;
a gate electrode inside the trench with a gate dielectric film between the gate electrode and the elongate trench, wherein the gate dielectric film is formed on a base surface of the elongate trench and is formed on a side wall of the elongate trench along its longitudinal direction;

an n-type channel region along a side wall of the elongate trench; and a p-type source region and a p-type drain region holding the channel region therebetween in a thickness direction of the semiconductor substrate, wherein a crystal plane of the base surface of the elongate trench and a crystal plane of the side wall of the elongate trench along its longitudinal direction are each a (110) plane, the gate dielectric film on the base surface and the gate dielectric film on the side wall along the longitudinal direction of the trench have a same thickness; and the channel region is formed along the side wall of the elongate trench along its longitudinal direction.

12. The semiconductor device according to claim 11, wherein the elongate trench is formed such that a long axis of a top surface of the elongate trench extends along a first direction that is parallel to the main surface of the semiconductor substrate and the elongate trench is composed of a plurality of trenches that are arranged at predetermined intervals in a second direction that intersects the first direction at right angles in plan view.

13. The semiconductor device according to claim 12, wherein the semiconductor device is cut out as a rectangular chip, a length of the chip in the first direction being longer than a length of the chip in the second direction.

14. The semiconductor device according to claim 11, wherein a dielectric layer is inside the elongate trench on a top surface of the gate electrode such that a top surface of the dielectric layer is flush with a top surface of the semiconductor layer.

15. The semiconductor device according to claim 11, wherein a thickness of the semiconductor layer ranges from 1 µm to 20 µm;
an impurity concentration of the drain region ranges from $1 \times 10^{15}$ cm$^{-3}$ to $1 \times 10^{16}$ cm$^{-3}$; and
an impurity concentration of the source region ranges from $1 \times 10^{19}$ cm$^{-3}$ to $1 \times 10^{20}$ cm$^{-3}$.

16. The semiconductor device according to claim 11, wherein a width of the elongate trench ranges from 0.1 µm to 0.5 µm, and a depth of the elongate trench ranges from 1 µm to 5 µm.

17. The semiconductor device according to claim 11, wherein the elongate trench is composed of a plurality of trenches arranged at intervals of between 0.1 µm and 0.5 µm.

18. The semiconductor device according to claim 11, wherein a thickness of a gate dielectric film along the side wall of the elongate trench ranges from 10 nm to 100 nm.

19. The semiconductor device according to claim 11, wherein the predetermined off-angle is 2°, 4° or 8° in a <100> direction with respect to the (110) plane.

20. The semiconductor device according to claim 11, further comprising:
a source electrode on a top surface of the semiconductor layer; and
a pad electrode on the top surface of the semiconductor layer,
wherein the pad electrode is formed along three sides of the top surface and a portion of the pad electrode at a corner is wider than other portions of the pad electrode.

* * * * *